United States Patent [19]

Matsuyama et al.

[11] Patent Number: 4,851,256
[45] Date of Patent: Jul. 25, 1989

[54] APPARATUS AND METHOD FOR MANUFACTURING PHOTOSENSITIVE AMORPHOUS SILICON OBJECTS

[75] Inventors: Toshiro Matsuyama, Tenri; Yoshimi Kojima; Shaw Ehara, both of Nara, all of Japan

[73] Assignee: Sharp Kabushiki Kaisha, Osaka, Japan

[21] Appl. No.: 131,346

[22] Filed: Dec. 9, 1987

Related U.S. Application Data

[63] Continuation of Ser. No. 790,812, Oct. 24, 1985, abandoned.

[30] Foreign Application Priority Data

Nov. 5, 1984 [JP] Japan ................................ 59-234652

[51] Int. Cl.$^4$ ......................... B05D 3/06; B05D 5/12; C23C 16/00
[52] U.S. Cl. ........................................ 427/39; 427/74; 118/730
[58] Field of Search ..................... 427/39, 74; 118/730

[56] References Cited

U.S. PATENT DOCUMENTS

| | | | |
|---|---|---|---|
| 4,466,380 | 8/1984 | Jansen | 427/39 |
| 4,501,766 | 2/1985 | Suzuki | 118/730 |
| 4,612,207 | 9/1986 | Jansen | 427/39 |
| 4,676,195 | 6/1987 | Yasui et al. | 427/39 |

FOREIGN PATENT DOCUMENTS 3217708 12/1982 Fed. Rep. of Germany ........ 427/39

Primary Examiner—Norman Morgenstern
Assistant Examiner—Marianne L. Padgett
Attorney, Agent, or Firm—Flehr, Hohbach, Test, Albritton & Herbert

[57] ABSTRACT

An apparatus for manufacturing photosensitive amorphous silicon objects comprises a pair of coaxial cylindrical electrodes inside a reaction tank of a plasma CVD device. A plurality of cylindrical substrates of an electrically conductive material disposed between these electrodes. A source gas is injected into the reaction tank through a plurality of inlets evenly spaced on the outer peripheral wall so that films of uniform quality can be produced efficiently.

9 Claims, 2 Drawing Sheets

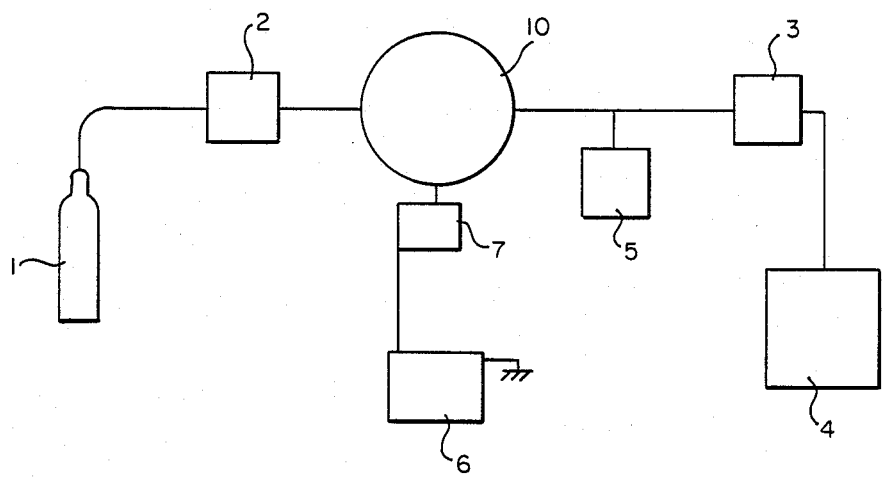
FIG.—1
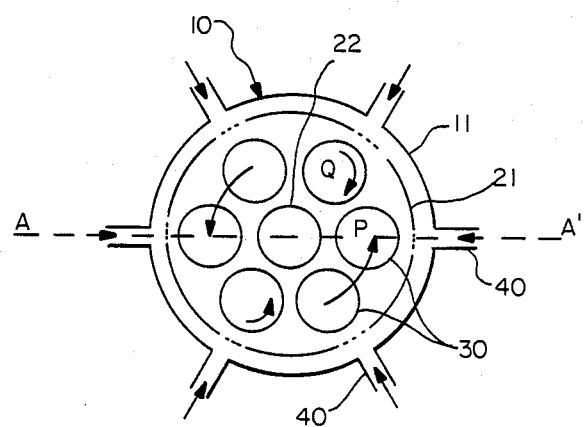
FIG.—2

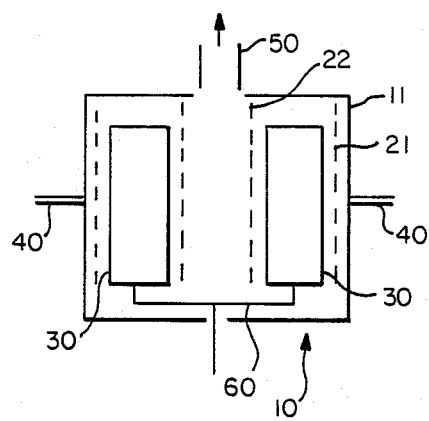
FIG.—3
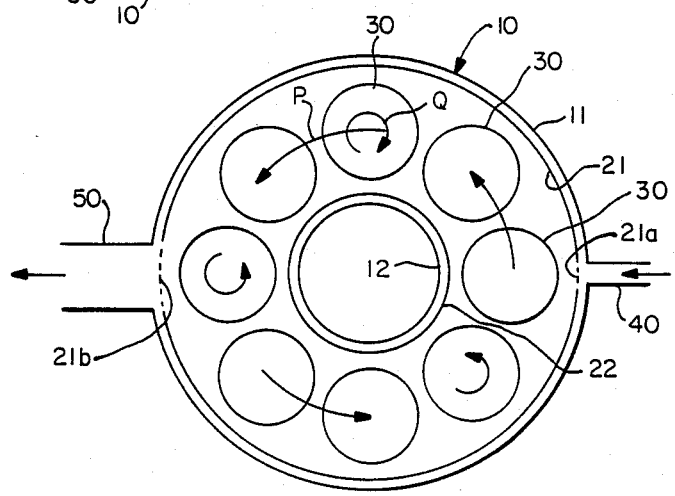
FIG.—4
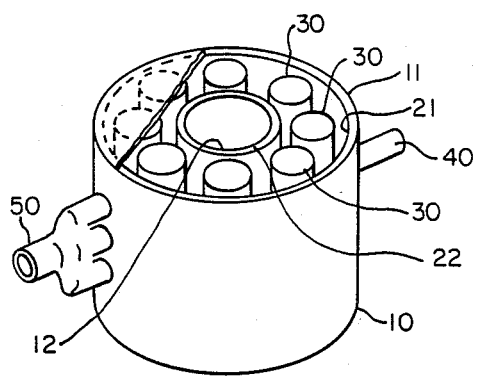
FIG.—5

APPARATUS AND METHOD FOR MANUFACTURING PHOTOSENSITIVE AMORPHOUS SILICON OBJECTS

This is a continuation of application Ser. No. 790,812 filed Oct. 24, 1985 now abandoned.

This invention relates to an apparatus and method for manufacturing photosensitive amorphous silicon objects.

Plasma CVD (chemical vapor deposition) devices have been considered the most appropriate type of apparatus for manufacturing photosensitive amorphous silicon objects. With this type of apparatus, one or more grounded substrates of an electrically conductive material are set inside a vacuum reaction tank, and electrodes so shaped as to surround the substrates are provided. High-frequency power is applied to these electrodes and a source gas such as monosilane ($SiH_4$) gas introduced inside the vacuum tank is brought into a plasma condition by electric discharge such that the effective radicals generated in the plasma form amorphous silicon films on the substrates.

The conventional apparatus of this type is typically composed of one or more cylindrical plasma CVD devices of capacitive combination type connected in a circular or linear formation and the substrates are adapted to rotate around themselves so that films can be formed uniformly. The source gas is generally introduced from an elevated position. There has also been a proposal to place inside the reaction tank a pipe with many holes through which the source gas is introduced so that the gas concentration will be uniform inside the tank. An exhaust outlet is usually provided at the bottom of the reaction tank.

With a conventional apparatus of the type described above, however, the gas route inside the reaction tank is short and hence the conversion efficiency of the source gas to form amorphous silicon is low, being less than 20%. When films are formed on several substrates, furthermore, it is extremely difficult to form films uniformly on all substrates inside the reaction tank even if they are made to rotate around themselves.

In order to remove the aforementioned disadvantages of the prior art technologies, a new apparatus for manufacturing photosensitive amorphous silicon objects was developed by two of the inventors herein and disclosed in Japanese Patent Application NO. 59-179908. This apparatus comprises two cylindrical electrodes coaxially disposed with respect to and inside of a cylindrical reaction tank of a plasma CVD device, and cylindrically shaped substrates are placed at equal intervals between these two electrodes with their axes parallel to those of the cylindrical electrodes such that they rotate not only around themselves but also around the smaller of the two coaxial cylindrical electrodes as shown in FIGS. 4 and 5.

In FIGS. 4 and 5, numeral 10 indicates a reaction tank composed of two coaxial cylinders and lids both at the top and at the bottom. An outer electrode 21 is provided adjacent the inner surface of the outer wall 11 and an inner electrode 22 adjacent the outer surface of the inner wall 12 so that the outer electrode 21 and the inner electrode 22 are also cylinders coaxial with the reaction tank 10. In the space between the outer electrode 21 and the inner electrode 22, there are disposed a plurality of cylindrical conductor substrates 30 with their axes parallel to the central axis of these electrodes 21 and 22, at equal distances therefrom and separated from the adjacent ones by same distances. A driving means (not shown) and a gear mechanism (not shown) are also provided such that these cylindrical substrates 30 rotate around the inner wall 12 as shown by the arrow P in FIG. 4 while rotating around themselves as shown by the arrow Q. An inlet 40 for introducing the source gas into the tank 10 and an exhaust outlet 50 are provided on the outer wall 11 on its opposite sides, or 180° away from each other. The parts 21a and 21b of the outer electrode 21 corresponding to the inlet 40 and the outlet 50 are made in a mesh-like form.

Although a device of the type shown in FIGS. 4 and 5 is capable of producing uniform photosensitive amorphous silicon objects relatively efficiently, experiments have since shown that improvements are desirable regarding the speed of film formation. It is therefore an object of the present invention to provide an apparatus and method for manufacturing photosensitive amorphous silicon objects of uniform quality with improved speed with which films of photosensitive layers can be formed.

The above and other objects of the present invention are achieved by an apparatus which comprises coaxial cylindrical electrodes inside a reaction tank of plasma CVD device such that cylindrical conductor substrates are disposed between these electrodes, the outer peripheral wall of the tank having a plurality of inlets for introducing a source gas into the reaction tank.

The accompanying drawings, which are incorporated in and form a part of the specification, illustrate one embodiment of the present invention and, together with the description, serve to explain the principles of the invention. In the drawings:

FIG. 1 is a drawing for showing the composition of an apparatus according to one embodiment of the present invention.

FIG. 2 is a horizontal cross-sectional view of a reaction tank for an apparatus of the present invention, FIG. 3 is a cross-sectional view along the line A-A' in FIG. 2, FIG. 4 is a horizontal cross-sectional view of a principal part of an apparatus for manufacturing photosensitive amorphous silicon objects developed by two of the present inventors during the course of research resulting in this invention.

FIG. 5 is a diagonal view of the apparatus of FIG. 4.

The present invention discloses an improved method of introducing the source gas for increasing the speed of film formation. When films are formed by the plasma decomposition of monosilane gas or polysilane gas, the method of introducing the source gas is very important. In a plasma of monosilane gas or polysilane gas, a large amount of radicals which are important for film formation is available near the inlet through which the source gas is introduced but hydrogen becomes the main component of the plasma as the distance from the source gas inlet increases and the concentration of the radicals need for film formation becomes low. The apparatus of FIGS. 4 and 5 discussed above become more effective, therefore, if the source gas is introduced to the trojectory of the substrates through as many inlets as possible, and an apparatus according to the present invention is characterized in that the peripheral outside wall of the reaction tank is provided with a plurality of inlets through which the source gas can be introduced.

FIG. 1 is a schematic drawing for showing the composition of an apparatus embodying the present invention. FIG. 2 is a horizontal cross-sectional view of a reaction tank according to one embodiment of the present invention and FIG. 3 is a cross-sectional view along the line A-A' of FIG. 2. In these figures, components which are identical to those in the previously considered apparatus of FIGS. 4 and 5 are indicated by the same numerals.

As shown in FIG. 1, an apparatus of the present invention for manufacturing photosensitive amorphous silicon objects comprises a source gas container 1, a flow controller 2, a mechanical booster pump system 3, an exhaust gas processing means 4, a diffusion pump system 5, a high frequency power source 6, a matching box 7 and a reaction tank 10 into which the source gas from the container 1 is introduced through the flow controller 2. The exhaust gas is passed through the mechanical booster pump system 3 into the processing means 4 where it is processed. A high frequency power is inputted from the source 6 through the matching box 7.

As shown in FIGS. 2 and 3, the reaction tank 10 is cylindrically shaped, having a cylindrical outer electrode 21 formed on, or set near the inner surface of the outer peripheral wall 11 and a cylindrical inner electrode 22 disposed coaxially with the outer electrode 21. The inner electrode 22 serves also as the inner peripheral wall of the reaction tank 10, being in an insulated relationship with the main housing thereof and functioning as a high frequency electrode. It may be of a mesh structure or made of porous pores.

A plurality of cylindrical substrates 30 made of an electrically conductive material are disposed between the outer electrode 21 and the inner electrode 22 as equal distances therefrom with their axes parallel to the central axis of symmetry of these electrodes 21 and 22. At the bottom of the tank 10, there is a rotary mechanism 60 as shown in FIG. 3 for causing the substrates 30 to rotate both around themselves and around the inner electrode 22. FIG. 2 shows a mode of operation wherein the substrates 30 rotate counterclockwise around the inner electrode 22 as shown by the arrow P and clockwise around themselves as shown by the arrow Q.

The outer peripheral wall 11 is provided with six inlets 40 through which the source gas is introduced into the tank 10. As shown in FIG. 2, these six inlets 40 are evenly spaced peripherally, or at angular intervals of 60° as seen in the direction of the axis of the cylinders. An outlet 50 is provided as shown in FIG. 3 so that the gas inside the tank 10 can be removed along the central axis through the inner electrode 22.

In summary, the reaction tank 10 of the present invention is so structured that the source gas is injected thereinto through a plurality of inlets 40, passes through the porous inner electrode 22 and is ejected form the outlet 50. This has the effect of causing a large portion of the gas to pass near the plurality of substrates and the source gas is used significantly more efficiently. This increases the speed of film formation and hence improves the productivity.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the number of gas inlets is not limited to six, the number of substrates to be placed inside the tank is not restricted to that depicted in FIG. 2 and the FIGS. 2 and 3 are not intended to show preferred dimensional relationships among the components. The embodiment was chosen and described in order to best explain the principles of the invention and its practical application to thereby enable others skilled in the art to best utilize the invention in various embodiments and with various modifications as are suited to the particular use contemplated.

What is claimed is:

1. A plasma chemical vapor deposition apparatus for manufacturing photosensitive amorphous silicon objects comprising
    a reaction tank structure with a cylindrical inner surface with a plurality of inlets for introducing a source gas therethrough into said reaction tank structure,
    cylindrical outer and inner electrodes disposed inside said reaction tank structure in coaxial relationship with respect to each other and to said cylindrical inner surface of said reaction tank structure, said inner electrode being porous and adapted to pass said source gas therethrough, and
    cylindrical substrates of an electrically conductive material disposed between said electrodes.

2. The apparatus of claim 1 wherein said plurality of inlets are distributed nearly evenly around the periphery of said outer wall.

3. The apparatus of claim 1 further comprising a rotary mechanism for causing said substrates to rotate both around themselves and around said inner cylindrical electrode.

4. The apparatus of claim 1 further comprising an outlet at a position on the central axis of said cylindrical electrodes.

5. The apparatus of claim 2 further comprising an outlet at a position on the central axis of said cylindrical electrodes.

6. The apparatus of claim 1 further comprising a high frequency power source.

7. The apparatus of claim 1 further comprising a gas outlet so disposed that said source gas passes through said cylindrical inner electrode to reach said outlet.

8. A method for manufacturing photosensitive amorphous silicon objects comprising the steps of
    arranging a plurality of cylindrical electrically conductive substrates coaxially in an evenly spaced circular formation,
    causing said substrates to rotate both around themselves and around a cylindrical and porous inner electrode inside a cylindrical outer wall coaxial with said inner electrode, and
    introducing a source gas for plasma CVD through a plurality of inlets provided on said outer wall, said inlets being evenly spaced around said cylindrical outer wall.

9. The method of claim 8 further comprising the step of causing said source gas to pass through said porous inner electrode.

* * * * *